United States Patent [19]

Anderle

[11] Patent Number: 4,765,273
[45] Date of Patent: Aug. 23, 1988

[54] TRANSPORTING DEVICE WITH ROLLER SYSTEMS FOR VACUUM-COATING INSTALLATIONS

[75] Inventor: Friedrich Anderle, Hanau am Main, Fed. Rep. of Germany

[73] Assignee: Leybold-Heraeus GmbH, Cologne, Fed. Rep. of Germany

[21] Appl. No.: 912,355

[22] Filed: Sep. 26, 1986

[30] Foreign Application Priority Data

Jul. 16, 1986 [DE] Fed. Rep. of Germany ....... 3623970

[51] Int. Cl.$^4$ ............................................. B05C 13/02
[52] U.S. Cl. .................................... 118/729; 118/50;
  118/503; 198/624; 198/836; 204/298
[58] Field of Search ................ 198/624, 836; 204/298;
  118/729, 50, 324, 503, DIG. 9

[56] References Cited

U.S. PATENT DOCUMENTS 3,132,785  5/1964  Kunz ............................. 198/624 X
3,360,260  12/1967  Rapparlie et al. .................. 198/623
4,042,128  8/1977  Shrader ........................... 118/719 X
4,187,801  2/1980  Monk ................................. 118/729

Primary Examiner—John P. McIntosh
Attorney, Agent, or Firm—Felfe & Lynch

[57] ABSTRACT

Transporting device for vacuum coating installations with several stations and with roller systems (3, 4) for the guidance and advance of essentially two-dimensional substrate holders (1) in a vertical position along a given transporting path through the stations. To avoid interference with the coating process by falling layer material, the substrate holders (1) are guided exclusively in the area of their lower edge (2) by roller systems (3, 4). In a preferred example of the operation, guide rollers are disposed in pairs in the area of the lower edge (2) of the substrate holders (1), the substrate holder (1) being held between said guide rollers. The guide rollers (5, 6) are rotatable about vertical axes A1, A2.

9 Claims, 5 Drawing Sheets

4,765,273

TRANSPORTING DEVICE WITH ROLLER SYSTEMS FOR VACUUM-COATING INSTALLATIONS

BACKGROUND OF THE INVENTION

The invention relates to a transporting device for vacuum coating installations with several stations and with roller systems for the guidance and advance of essentially two-dimensional substrate holders in a vertical position along a given transport path through the stations.

The substrate holders used are either plates with cutouts shaped to correspond to the substrates or frames with struts, to which the substrates are attached. In general, a substrate holder serves to carry a large number of substrates. Since the thickness of such a plate or frame is very small in relation to its principal plane, such a substrate holder can be referred to in a simplified fashion as two-dimensional.

Provided that the substrates are to be coated on only one side, the substrate holder is passed through the coating installation with its principal plane in the horizontal position and, when cathode sputtering is used as the coating method, is coated from above. For this purpose, the substrate holders, several of which are always passed cyclically and consecutively through the coating installation, lie on transporting rollers as they are passed through said installation, at least some of the rollers being driven. Such roller systems do not create any problems with respect to the coating process.

For the two-sided coating of the substrates however, the substrate holders are generally passed through the installation with their principal plane aligned in the vertical direction. With methods employed in the past, the substrate holders have been provided at their upper and lower longitudinal edges with prismatic longitudinal grooves, with which in each case upper and lower guide rollers meshed. However, the substrate holders are also coated during the coating process, the thickness of the coating growing in the course of time, until separation of layer particles takes place at isolated places. This separation is promoted appreciably by the guide rollers and especially the upper guide rollers lead to a situation in which the substrates are passed through a shower of layer particles, which have flaked or peeled off, so that a defective coating with the feared pin holes results.

SUMMARY OF THE INVENTION

It is therefore an object of the invention to provide a transporting device of the type initially described, in which interference with the coating process by falling layer material ceases as far as at all possible.

This objective is accomplished inventively for the initially described transporting device owing to the fact that the substrate holders are guided exclusively in the area of their lower edge through the roller systems.

This comes about in a particularly simple manner owing to the fact that, in the area of the lower edge of the substrate holders, guide rollers are disposed in pairs, between which the substrate holder is held and which are rotatable about vertical axes A1, A2.

Due to the inventive solution, the substrate holders are so to speak overhung mounted and there is no rolling contact in their upper region with any guide or transporting rollers. Consequently also, no overgrown layer material is released at these sites. It should, however, be noted that the guide rollers are also coated of course and that, during their rolling motion of the substrate holders, peeled-off particles would also be released by them. Due to the absence of guide rollers in the upper region of the substrate holders, there is no contamination of the substrates by particles and no formation of pin holes to any noticeable extent. This advantage is particularly important for so-called magnetic memory plates, which must satisfy particularly stringent requirements with respect to the absence of pin holes in the magnetic layers.

It is moreover particularly advantageous to provide guide rollers with elastomeric coatings and to guide the substrate holders which are wedged between the guide rollers.

In this manner, guidance is achieved with a precision, which was previously regarded to be impossible for substrate holders, which were not guided at their upper longitudinal edges.

It is furthermore of advantage if the driving mechanism for at least one of the guide rollers is disposed below the base plate, which borders the vacuum chamber towards the bottom.

In this manner, the driving mechanism, which may be a motor as well as a chain gear, a toothed belt pulley, etc., is outside of the vacuum chamber and also outside of the coating process. All driving elements for the chain wheels or belt pulleys, such as chains and toothed belts, are also outside of the process areas and are therefore not hit by the coating material.

Above all, however, by mounting the driving mechanism outside of the process areas, a driving mechanism passing over all guide rollers can be used. This would otherwise not have been possible, since the individual treating stations or vacuum chambers usually are separated from one another by isolation valves, which would preclude the driving mechanisms being connected within the processing areas.

Other advantageous refinements of the object of the invention are contained in the remaining dependent claims; they are not dicussed in greater detail in the specifications.

Examples of the operation of the object of the invention are explained in greater detail in the following by means of FIGS. 1 to 5.

DESCRIPTION OF THE PREFERRED EMBODIMENTS

Figure 1:
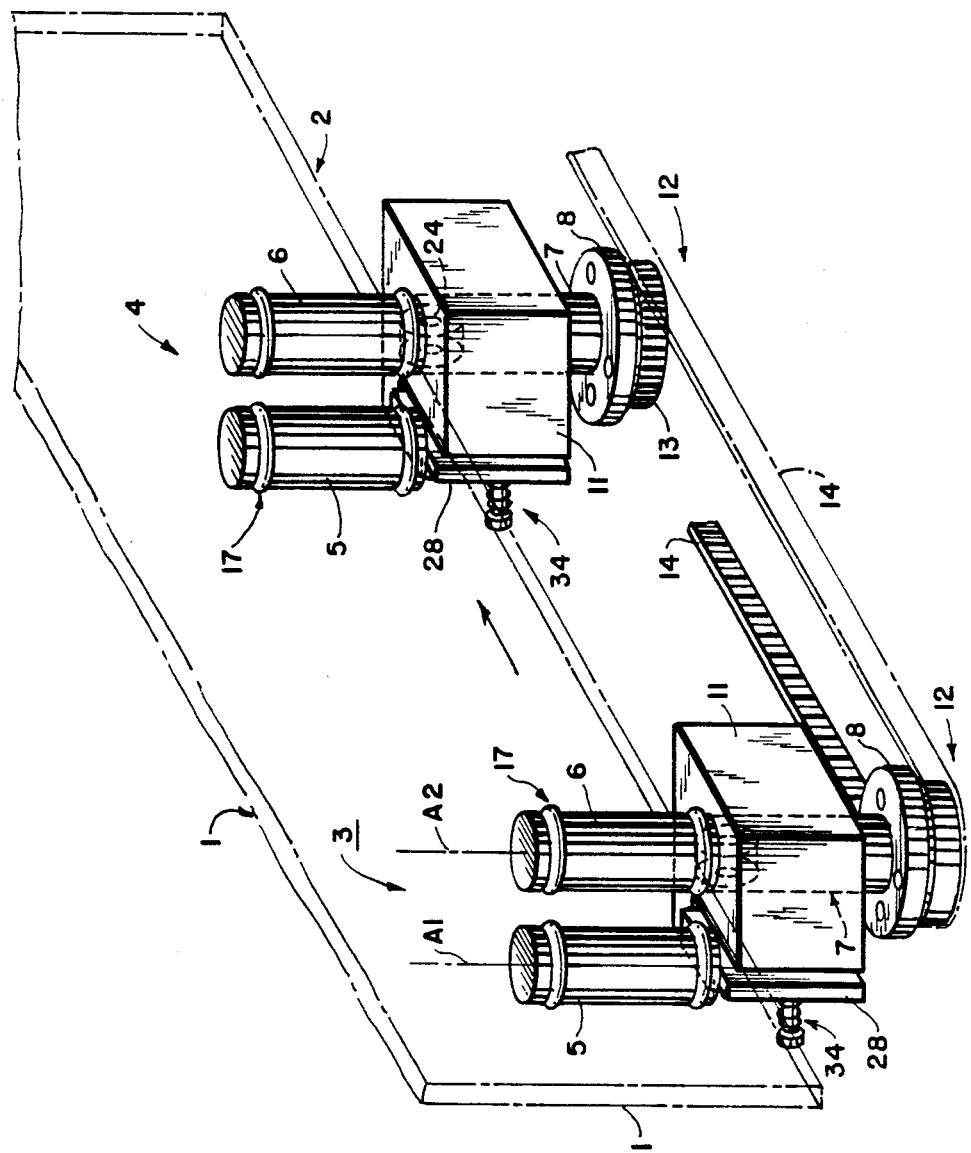
FIG. 1 shows a perspective representation of a substrate holder with two pairs of guide rollers including their common driving mechanism.
Figure 4:
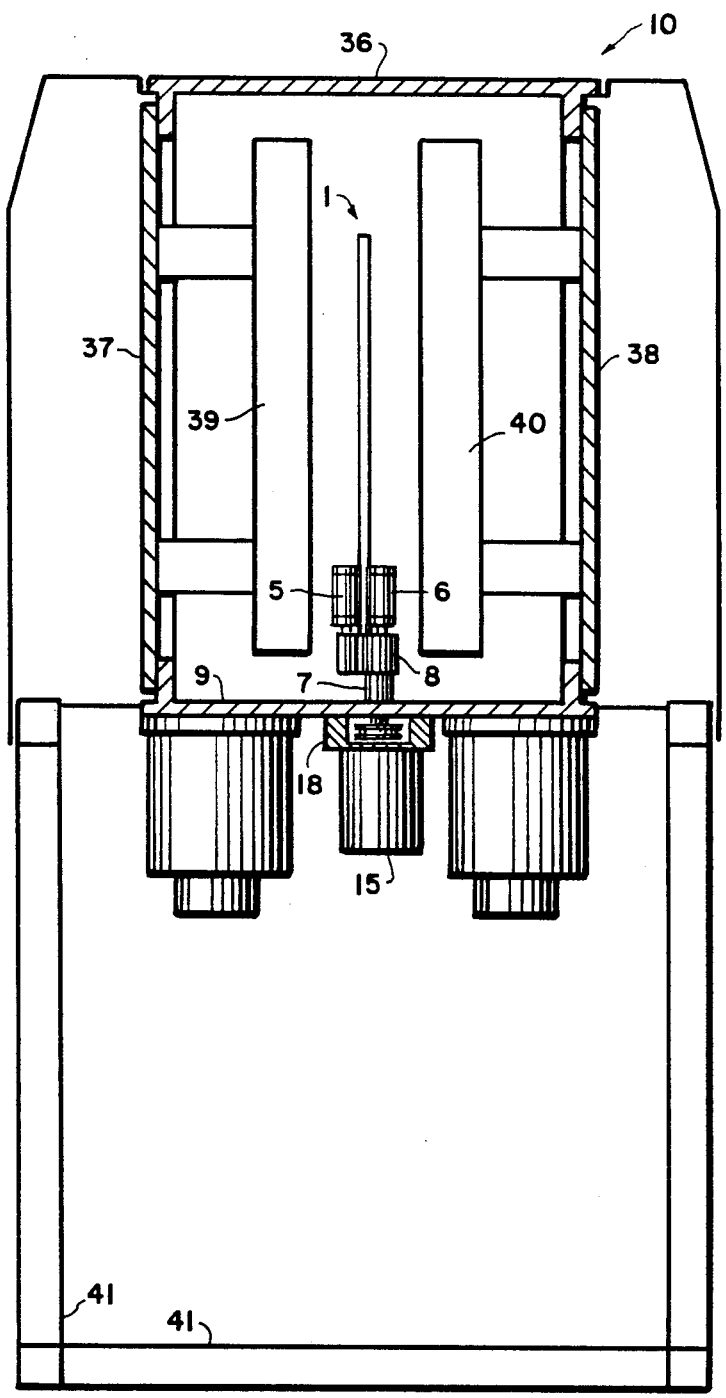
FIG. 4 shows a vertical section through a complete vacuum coating installation with a transporting device like those of FIGS. 1 to 3.

In FIG. 1, a substrate holder 1 is shown, which comprises a vertical, massive rectangular aluminum plate with a large number of recesses, which are not shown here, for holding a corresponding number of substrates, which are also not shown. These substrates are to be coated while the substrate holder 1 moves at a uniform speed horizontally relative to a coating source (FIG. 4). The substrate holder comprises a lower edge 2 and is portrayed as if it were transparent, so that the roller systems 3 and 4 can be demonstrated better.

Figure 2:
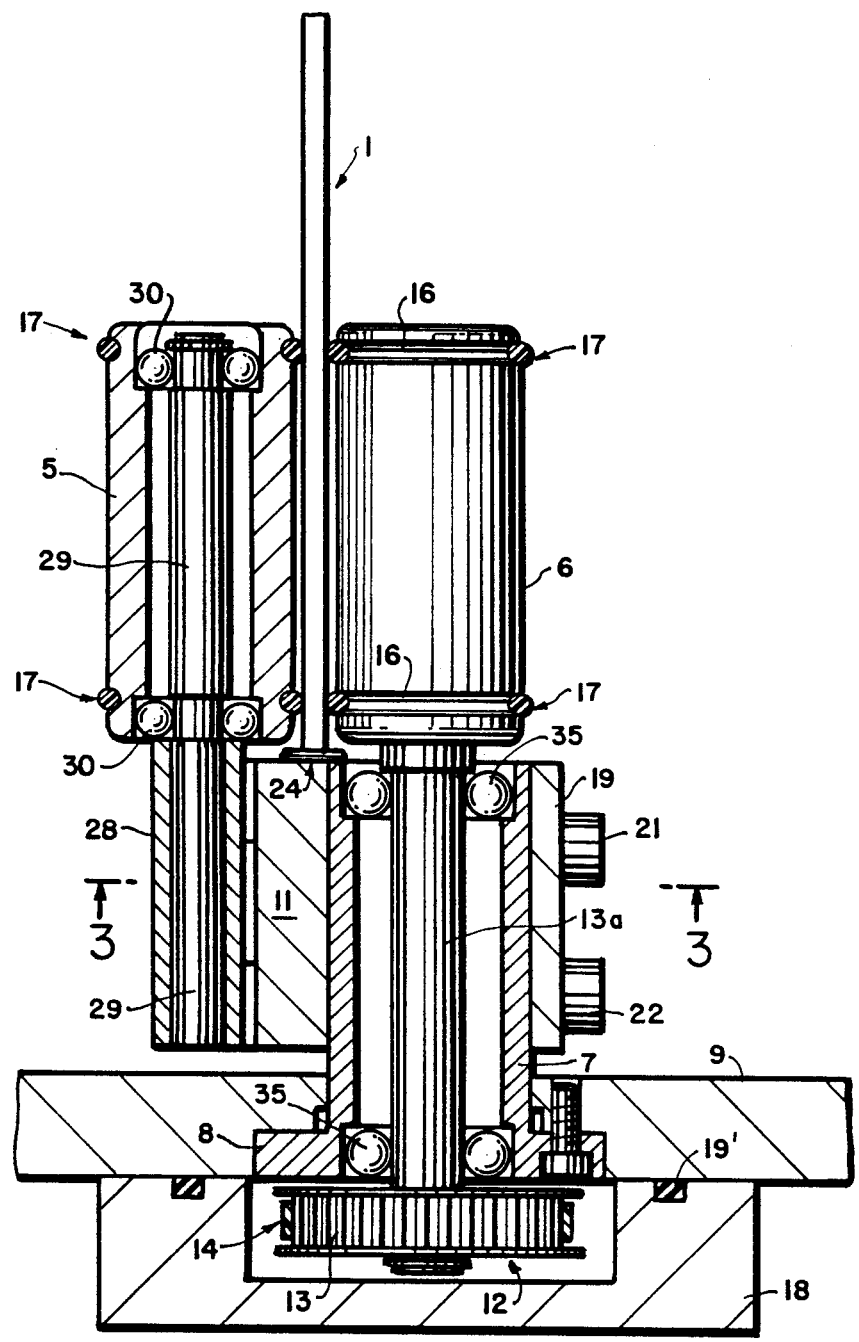
FIG. 2 shows part of a vertical section through a pair of guide rollers with their mounting system and their driving mechanism along line II—II of FIG. 3.

Each roller system 3 (or 4) comprises a pair of guide rollers 5 and 6, which, between themselves, enclose the area of the lower edge 2 of the substrate holder and hold it fast non-positively. The guide rollers 5 and 6 can be rotated about the vertical axes A1 and A2. The roller systems 3 and 4 are in each case mounted over a bearing sleeve with a flange 8 on a base plate 9 (not shown here) of a vacuum chamber 10 (FIGS. 2 and 4). The bearing sleeve 7 serves for mounting the guide roller 6 directly. The other guide roller 5 is fastened to the bearing sleeve 7 by means of a pedestal 11, which will be dealt with in greater detail in connection with FIGS. 2 and 3.

At each of the lower ends of the shafts carrying the guide rollers 6, there is a driving mechanism 12, which comprises a toothed belt pulley 13 with a toothed belt 14, which is guided over this pulley. This toothed belt leads to a drive motor 15, which lies outside the plane of the drawing, so that the guide rollers 6 are driven synchronously.

As is evident from FIG. 2, the guide rollers 5 and 6 comprise a hollow cylinder, in the upper and lower ends of which a groove 16 is cut, into each of which an elastomeric coating 17 is inserted. This elastomeric coating comprises an O-ring packing, which is sufficiently vacuum tight. From the right half of FIG. 2, it can be inferred how the guide roller 6 is connected over a drive shaft 13a with the driving mechanism 12 or with the toothed belt pulley 13. The toothed belt pulley is disposed with the toothed belt 14 below the base plate 9. The vacuum chamber is sealed towards the outside by a cover 18, which overlaps the toothed belt 14 over the whole of its length and which is joined from below to the base plate 9 with insertion of a seal 19.

Figure 3:
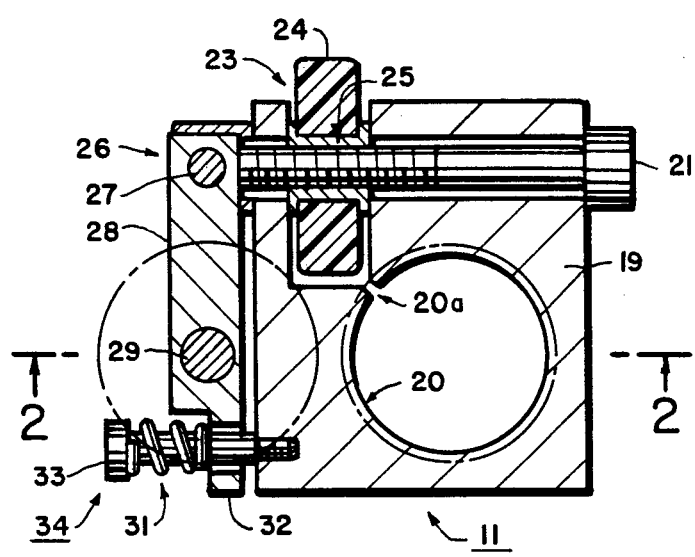
FIG. 3 shows a horizontal section through the object of FIG. 2 along the line III—III.

While the guide roller 6 with the drive shaft 13a is mounted immovably in the bearing sleeve 7, the guide roller 5, which is on the other side of the substrate holder 1, is mounted tiltably; this will be explained in greater detail with the help of FIG. 3.

The pedestal 11 comprises a clamping piece 19, which has a cylindrical bore 20 with a slit 20a parallel to the axis of said bore and which can be braced by two tension screws 21 and 22 on the bearing sleeve 7. In the clamping piece 19, there is furthermore a recess 23, in which a support roller 24 is inserted, which projects above the upper end face of the pedestal 11 (FIG. 2). The support roller 24 is mounted on a bearing bush 25, which in turn is penetrated by the uppermost tension bolt 21.

At the one vertical edge of the clamping piece 19, there is a hinge 26 with an articulated axle 27, to which a bracket 28 is elastically coupled, in which a borehole for holding a bearing pin 29 is disposed, which at its upper end carries the guide roller 5 over ball bearing 30. The distance of the bearing pin 29 from the drive shaft 13a can be changed by the tiltability of the bracket 28. The bracket 28 is, however, under a pretension and moreover under the action of a pressure spring 31, which is supported on the one hand at an extension 32 of the bracket 28 and on the other, at the head 33 of an adjusting screw 34. By the setting of the adjusting screw 34 on the one hand and the choice of the pretension of the pressure spring 31 on the other, not only can the distance between the guide rollers 5 and 6 be fixed, but also the contacting pressure between the guide rollers and the substrate holder 1.

The elastomeric coatings 17 lie pairwise in each case in a common upper and lower horizontal plane, so that there is in each case a two-point support within each roller system 3 or 4, each substrate holder, however, being held at at least 4 points.

The spatial position, assumed by the support roller 24 relative to the space between the guide rollers 5 and 6, is also evident from FIG. 2. Care must be taken to ensure that the substrate holder 1 lies on the support roller 24 and that the axis of the support roller 24, which coincides with the axis of the tension screw 21, runs in the direction normal to the main plane of the substrate holder 1.

The drive shaft 13a of the guide roller 6 is also supported by means of ball bearings 35 in the bearing sleeve 7.

In FIG. 4, a vacuum chamber 10 is shown, which, aside from the base plate 9, has an upper wall 36 and two sidewalls 37 and 38. At each of these sidewalls, a coating source 39 and 40 is mounted, both of which are constructed as magnetron cathodes, in order to be able to coat the substrates in the substrate holder 1 from both sides. In practice, the coating sources 39 and 40 are staggered in depth. The vacuum chamber is mounted on a supporting stand 41, so that the sidewalls 37 and 38 are within the region of the upper part of the body of an operator.

Figure 5:
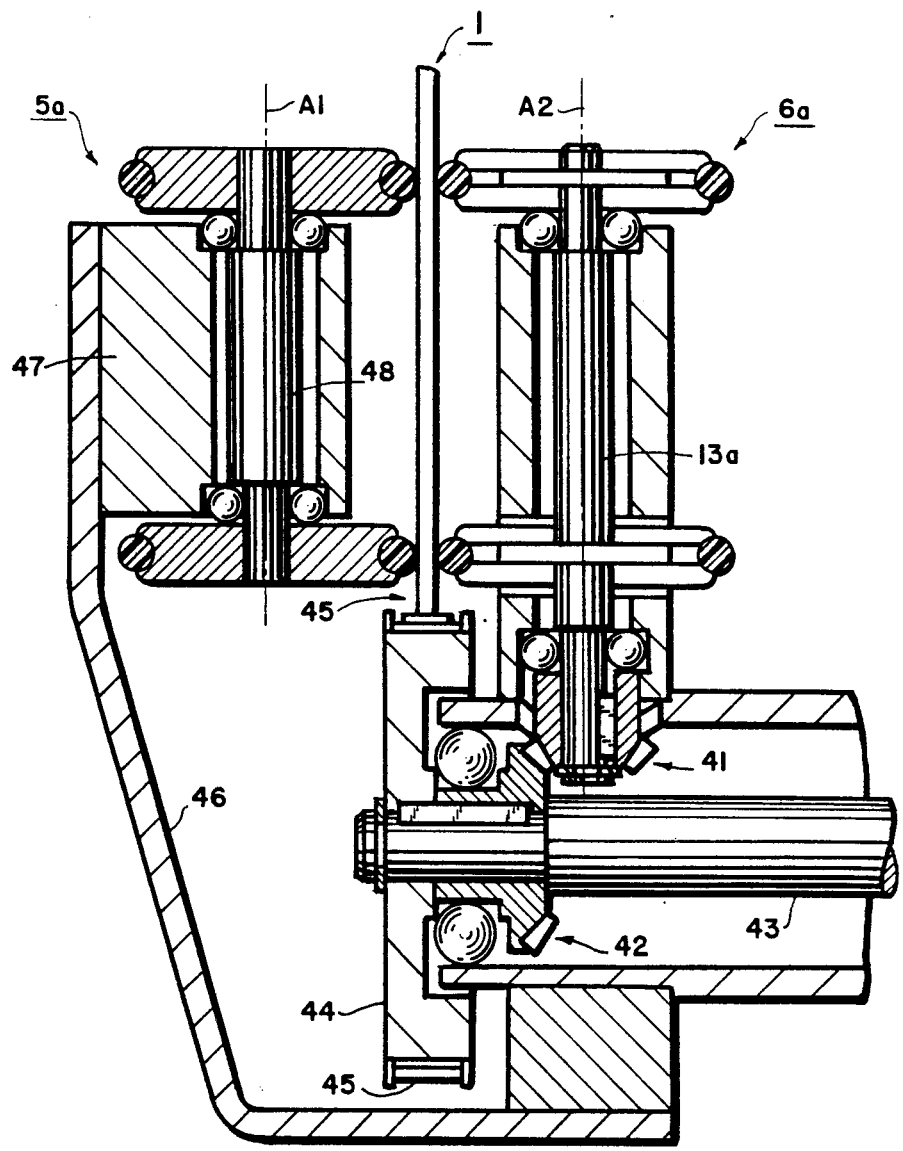
FIG. 5 shows a vertical section through a pair of transporting rollers similar to those of FIG. 2, but with a different driving system.

In FIG. 5, a variation of the object of FIG. 2 is shown. The guide rollers 5a and 6a in this case are not formed by a continuous (metal) cylinder, but by circular disks, which are mounted at an axial distance from one another on a common shaft. The drive shaft 13a is driven over a pair of conical wheels 41 and 42 by means of a horizontal shaft 43, at the end of which below the transporting path of the substrate holder 1 there is a toothed belt pulley 44, which is coupled over a toothed belt 45 with at least one additional (not shown) toothed belt pulley. It can be seen that the toothed belt 45 is the supporting element for the substrate holder 1 (similar to the support roller 24 in FIGS. 1 to 3). Guide roller 5a is fixed spatially relative to guide roller 6a by a frame 46, which at its upper end carries a pedestal 47 for a shaft 48, which is not driven and to the two ends of which the circular disks forming the guide rollers 5a are attached. By adjusting the frame 46, the distance or the pretension between the two guide rollers 5a and 6a can be adjusted here also.

In a roller system of FIG. 5, it is also possible, without having to take over all the details, not to drive the guide rollers 5a and 6a, that is, to operate them as so-called idle roller, while the positive drive can be affected exclusively by the support roller 24 ( which is then provided with a driving mechanism) or the toothed belt pulley 44, while a friction coating, in the case of FIG. 5 the toothed belt, provides for sufficient positive drive forces.

There has thus been shown and described a novel transporting device for vacuum-coating installations which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention which is limited only by the claims which follow.

I claim:

1. In a transporting device for vacuum-coating installations with several stations and having at least one roller system for the guidance and advance of essentially two-dimensional substrate holders in a vertical position along a given transporting path through the stations, said roller system comprising at least one pair of opposed guide rollers mounted for rotation about respective vertical axes, for guiding the lower edges of said substate holders between said pair of rollers, the improvement wherein said substrate holders are guided exclusively in the area of their lower edges, by said guide rollers and wherein both guide rollers of each pair include circumferential contact surfaces at the top and bottom ends thereof, said contact surfaces of one roller in each pair being disposed laterally opposite the contact surfaces of the other roller thereof, thereby providing means for firmly gripping and guiding said substrate holders in the area of their lower edges so as to prevent them from tipping laterally.

2. A transporting device as defined in claim 1, wherein said contact surfaces are formed by elastomeric coatings on said guide rollers.

3. A transporting device as defined in claim 2, wherein said elastomeric coatings comprise O-ring packings.

4. A transporting device as defined in claim 3, further comprising means for guiding the substrate holders while they are clamped between said guide rollers.

5. A transporting device as defined in claim 1, wherein said roller system further comprises means for driving at least one guide roller of a pair of rollers.

6. A transporting device as defined in claim 5, wherein said vacuum coating installation includes a vacuum chamber, wherein said roller system comprises a base plate disposed near the bottom of said vacuum chamber, and wherein said driving means for at least one of said guide rollers is disposed below said base plate.

7. A transporting device as defined in claim 5, wherein said means for driving said one guide roller includes a horizontal shaft, a toothed belt pulley disposed at the end of said shaft below the transporting path of the substrate holder, and a a toothed belt which couples said belt pulley with at least one additional toothed belt pulley, and wherein said toothed belt is the supporting element for the substrate holder.

8. A transporting device as defined in claim 1, further comprising a pedestal associated with each pair of guide rollers, said pedestal including a clamping element for a bearing bushing of one guide roller of a pair of rollers; an elastically coupled bracket for holding a bearing pin of the other guide roller of said pair; and an adjusting screw for adjusting the distance between the bearing pin and the clamping element, thereby to adjust the contacting pressure between the contact surfaces of said guide rollers.

9. A transporting device as defined in claim 8, further comprising a support roller mounted on said pedestal with a horizontal axis for supporting the substrate holders.

* * * * *